United States Patent
Sinha et al.

(10) Patent No.: US 8,441,874 B2
(45) Date of Patent: May 14, 2013

(54) MEMORY DEVICE WITH ROBUST WRITE ASSIST

(75) Inventors: Rakesh Kumar Sinha, Bihar (IN); Dhori Kedar Janardan, Gujrat (IN); Sachin Gulyani, Delhi (IN)

(73) Assignee: STMicroelectronics International N.V., Amsterdam (NL)

( * ) Notice: Subject to any disclaimer, the term of this patent is extended or adjusted under 35 U.S.C. 154(b) by 89 days.

(21) Appl. No.: 12/979,757

(22) Filed: Dec. 28, 2010

(65) Prior Publication Data

US 2012/0163110 A1    Jun. 28, 2012

(51) Int. Cl.
*G11C 7/00* (2006.01)
(52) U.S. Cl.
USPC .......................................... 365/194; 365/203
(58) Field of Classification Search .................. 365/154, 365/189.04, 189.07, 189.11, 210.1, 203, 365/189.16, 194, 204
See application file for complete search history.

(56) References Cited

U.S. PATENT DOCUMENTS

| | | | |
|---|---|---|---|
| 6,104,653 A * | 8/2000 | Proebsting | 365/203 |
| 6,934,209 B2 | 8/2005 | Marr | |
| 8,004,918 B2 | 8/2011 | Gouin | |
| 2007/0030722 A1 * | 2/2007 | Chanussot et al. | 365/154 |
| 2007/0030741 A1 * | 2/2007 | Nii et al. | 365/189.11 |
| 2007/0081379 A1 * | 4/2007 | Clinton et al. | 365/149 |
| 2008/0130378 A1 * | 6/2008 | Nautiyal | 365/189.11 |
| 2009/0235171 A1 | 9/2009 | Adams et al. | |
| 2010/0188909 A1 * | 7/2010 | Kenkare et al. | 365/189.16 |
| 2012/0170391 A1 * | 7/2012 | Janardan et al. | 365/194 |

OTHER PUBLICATIONS

Wang, et al., A 45nm Dual-Port SRAM with Write and Read Capability Enhancement at Low Voltage, IEEE, Sep. 26-29, 2007 ; pp. 211-214, ISBN: 978-1-4244-1592-2, Digital Object Identifier : 10.1109/SOCC.2007.4545460, located at http://ieeexplore.ieee.org/stamp/stamp.jsp?tp=&arnumber=4545460.

* cited by examiner

*Primary Examiner* — Douglas King
(74) *Attorney, Agent, or Firm* — Gardere Wynne Sewell LLP

(57) ABSTRACT

A memory circuit includes a memory cell configured to be re-writable. A write enable circuit is configured to enable writing a signal via a pair of bit lines to the memory cell depending on a write signal. A charge supply circuit is configured to supply a charge to at least one of the pair of bit lines. A charge supply controller is configured to control the charge supply circuit to disable the supply of charge and couple the write enable circuit to at least one of the pair of bit lines after a first determined period following the reception of the write signal.

22 Claims, 6 Drawing Sheets

MEMORY DEVICE WITH ROBUST WRITE ASSIST

TECHNICAL FIELD

The present invention relates to memory devices, for example but not exclusively to random access memory devices in integrated circuits.

BACKGROUND

Memory devices are commonly employed as internal storage areas in computer or processors or other types of electronic equipment. One specific type of memory used to store data in a computer is random access memory (RAM) such as static RAM (SRAM) or dynamic RAM (DRAM). RAM is typically used for example as main memory in a computer. Furthermore random access memory is generally volatile in that once power has been removed the data stored in the memory is lost.

A typical SRAM device includes an array of individual SRAM cells. Each SRAM cell is capable of storing a binary voltage value therein which represents a logical data bit in other words a '0' or '1'. One known configuration for SRAM cells includes a pair of cross coupled devices such as inverters formed from pairs of complementary metal oxide semiconductor (CMOS) transistors. For example each inverter can be a PMOS FET (p-channel field effect transistor) and a complimentary NMOS FET (n-channel field effect transistor). The inverter is connected in a cross coupled configuration and forms a latch that stores the data as long as the power is maintained to the memory cell. In a conventional six transistor (6T) cell, a pair of access transistors or pass gates (actuated by a word-line WL signal) selectively couples the inverters to a pair of complimentary bit-lines (BL). In other SRAM designs any suitable number of transistors can be implemented such as for example 4T, 8T memory cells.

Designing SRAM cells traditionally involves a compromise between the read and write functions of the memory cell to maintain cell stability, the read performance and the write performance. The transistors which form the cross coupled pair should be weak enough to be overdriven during a write operation while also being strong enough to maintain a data value while driving a bit line during a read operation. The access transistors that connect the cross coupled cell nodes to the true and complement bit lines affect both the stability and performance of the cell. In one port or single port SRAM cells a single pair of access transistors is used for both read and write access to the cell. The gates are driven to a digital value in order to switch the transistors between an on and off the state. The write operation optimisation of the access transistors requires a low on-resistance however the read optimisation requires a high on-resistance to isolate the cell from the bit line capacitance and prevent a cell disturb event.

One proposed approach to improve write performance of SRAM device is to use a 'negative boost' to discharge a bit-line to a voltage level below the nominal low supply rail value (for example ground) so that the access transistors of the SRAM cell coupled to the discharge bit-line see a resultant increase in both the gate to source and the drain to source voltages.

However there are problems associated with this technique. In conventional negative bit line (BL) write assist (WA) in multi-port memory the BL can float and the negative charge is coupled (to pull the BL lower to register the change in state). If a second port is also on the negative charge can be lost and the bit line potential can rise to a potential $V_{dd}-V_t$ (which can be above zero) which leads to an unsuccessful write operation. One approach which has been applied to overcome this problem has been to use a relatively larger negative charge (to provide a larger negative boost or bump) to keep the bit line potential low for a longer period but this approach has the possible side effect or further problem of voltage breakdown of transistors causing failures in the memory cell. Furthermore the stability of un-selected cells in the column can also be a concern.

A further approach to the problem can be to use a regulated boost potential so that a constant negative potential is available however this has the further problem that the regulated boost requires additional power supply and regulator circuitry.

SUMMARY

It is an aim of embodiments presented herein to overcome these problems by applying short-circuit current compensation for the bit-line.

According to a first aspect, there is provided a memory circuit comprising: a memory cell configured to be re-writable; a write enable circuit configured to enable writing a signal via a pair of bit lines to the memory cell depending on a write signal; a charge supply circuit configured to supply a charge to at least one of the pair of bit lines; and a charge supply controller configured to control the charge supply circuit to disable the supply of charge and couple the write enable circuit to at least one of the pair of bit lines after a first determined period following the reception of the write signal.

The charge supply controller may comprise a dummy bit line configured to determine a third period wherein the third period is the difference between the first determined period and a second determined period following the reception of the write signal controlling the enablement of the supply of the charge.

The dummy bit line may comprise a current source configured to charge the dummy bit line; a current drain configured to simulate a multiport memory cell short circuit for the period later than the second determined period and during the third period; and a charge source configured to simulate the charge supply circuit applied to at least one of the bit lines.

The charge supply controller may comprise a second dummy bit line configured to determine the second determined period.

The second dummy bit line may comprise a current drain configured to simulate a write enable circuit current drain in at least one of the pair of bit lines following the reception of the write signal.

The dummy bit line current source may be controlled dependent on the second dummy bit line potential, wherein the dummy bit line current source may be enabled when the second dummy bit line potential is greater than a determined potential.

The dummy bit line current drain may be controlled dependent on the second dummy bit line potential, wherein the dummy bit line current drain may be enabled when the second dummy bit line potential is less than a second determined potential.

The dummy bit line may comprise a threshold determiner configured to determine when the dummy bit line potential is less than a determined value, wherein the threshold determiner output is configured to control the charge supply circuit to disable the supply of charge to at least one of the pair of bit lines.

The threshold determiner may be configured to determine when the dummy bit line potential is greater than a second determined value, wherein the threshold determiner output is configured to control the charge supply circuit to apply the supply of charge to at least one of the pair of bit lines.

The charge supply controller may be further configured to enable the supply of charge and decouple the write enable circuit to at least one of the pair of bit lines after the first determined period following the reception of the write signal.

An integrated circuit memory device may comprise the memory circuit as described herein.

A multiport memory circuit may comprise the memory circuit as described herein.

A processor may comprise the memory circuit as described herein.

According to a second aspect, there is provided a method of operating a memory circuit comprising: determining a first time period after a write enable signal, wherein after the determined first time period a supply of boost charge is disabled to at least one of a pair of bit lines coupled to a memory cell and the at least one of the pair of bit lines are coupled to a write driver.

The method may further comprise determining a third time period, the third time period being a difference between the first and a second determined time period, wherein determining the third time period comprises monitoring a dummy bit line coupled to a second dummy bit line.

Monitoring the dummy bit line may comprise: discharging the dummy bit line configured to simulate a multiport memory cell short circuit during the third time period following the second determined period; and applying a charge source configured to simulate the charge supply circuit applied to at least one of the bit lines.

Coupling the dummy bit line to the second dummy bit line may comprise: controlling the charging and discharging of the dummy bit line dependent on the potential of the second dummy bit line.

The method may comprise determining the second time period by monitoring the second dummy bit line.

Monitoring the second dummy bit line may comprise operating a current drain configured to simulate a write enable circuit current drain in at least one of the pair of bit lines following the reception of the write signal.

Charging of the dummy bit line may be enabled when the second dummy bit line potential is greater than a determined potential, and discharging may be enabled when the second dummy bit line potential is less than a second determined potential.

Monitoring the dummy bit line may comprise determining the dummy bit line potential is less than a determined value, wherein determining the first period comprises determining the dummy bit line potential is greater than the predetermined value.

Monitoring the dummy bit line may comprise determining the dummy bit line potential is greater than a second determined value, wherein determining the second period may comprise determining the second dummy bit line potential is greater than the predetermined value.

The method may further comprise: enabling, after the second determined time period, a supply of boost charge to at least one of the pair of bit lines coupled to the memory cell; and decoupling the at least one of the pair of bit lines from the write driver.

According to a third aspect there is provided a computer-readable medium encoded with instructions that, when executed by a computer, perform: determining a first time period after a write enable signal, wherein after the determined first time period a supply of boost charge is disabled to at least one of a pair of bit lines coupled to a memory cell and the at least one of the pair of bit lines are coupled to a write driver.

The computer-readable medium may be further encoded with instructions that, when executed by a computer, performs determining a third time period, the third time period being a difference between the first and a second determined time period, wherein determining the third time period comprises monitoring a dummy bit line coupled to a second dummy bit line.

Monitoring the dummy bit line may cause the computer to perform: discharging the dummy bit line configured to simulate a multiport memory cell short circuit during the third time period following the second determined period; and applying a charge source configured to simulate the charge supply circuit applied to at least one of the bit lines.

Coupling the dummy bit line to the second dummy bit line may cause the computer to perform: controlling the charging and discharging of the dummy bit line dependent on the potential of the second dummy bit line.

The computer-readable medium may be further encoded with instructions that, when executed by a computer, performs determining the second time period by monitoring the second dummy bit line.

Monitoring the second dummy bit line may cause the computer to perform operating a current drain configured to simulate a write enable circuit current drain in at least one of the pair of bit lines following the reception of the write signal.

Charging of the dummy bit line may be enabled when the second dummy bit line potential is greater than a determined potential, and discharging may be enabled when the second dummy bit line potential is less than a second determined potential.

Monitoring the dummy bit line may cause the computer to perform determining the dummy bit line potential is less than a determined value, wherein determining the first period comprises determining the dummy bit line potential is greater than the predetermined value.

Monitoring the dummy bit line may cause the computer to perform determining the dummy bit line potential is greater than a second determined value, wherein determining the second period may comprise determining the second dummy bit line potential is greater than the predetermined value.

The computer-readable medium may be further encoded with instructions that, when executed by a computer, performs: enabling, after the second determined time period, a supply of boost charge to at least one of the pair of bit lines coupled to the memory cell; and decoupling the at least one of the pair of bit lines from the write driver.

According to a fourth aspect there is provided an apparatus comprising at least one processor and at least one memory including computer program code the at least one memory and the computer program code configured to, with the at least one processor, cause the apparatus at least to perform: determining a first time period after a write enable signal, wherein after the determined first time period a supply of boost charge is disabled to at least one of a pair of bit lines coupled to a memory cell and the at least one of the pair of bit lines are coupled to a write driver.

The apparatus may further perform determining a third time period, the third time period being a difference between the first and a second determined time period, wherein determining the third time period comprises monitoring a dummy bit line coupled to a second dummy bit line.

Monitoring the dummy bit line may cause the apparatus to perform: discharging the dummy bit line configured to simulate a multiport memory cell short circuit during the third time period following the second determined period; and applying a charge source configured to simulate the charge supply circuit applied to at least one of the bit lines.

Coupling the dummy bit line to the second dummy bit line may cause the apparatus to perform: controlling the charging and discharging of the dummy bit line dependent on the potential of the second dummy bit line.

The apparatus may further perform determining the second time period by monitoring the second dummy bit line.

Monitoring the second dummy bit line may cause the apparatus to perform operating a current drain configured to simulate a write enable circuit current drain in at least one of the pair of bit lines following the reception of the write signal.

Charging of the dummy bit line may be enabled when the second dummy bit line potential is greater than a determined potential, and discharging may be enabled when the second dummy bit line potential is less than a second determined potential.

Monitoring the dummy bit line may cause the apparatus to perform determining the dummy bit line potential is less than a determined value, wherein determining the first period comprises determining the dummy bit line potential is greater than the predetermined value.

Monitoring the dummy bit line may cause the apparatus to perform determining the dummy bit line potential is greater than a second determined value, wherein determining the second period may comprise determining the second dummy bit line potential is greater than the predetermined value.

The apparatus may perform: enabling, after the second determined time period, a supply of boost charge to at least one of the pair of bit lines coupled to the memory cell; and decoupling the at least one of the pair of bit lines from the write driver.

According to a fifth aspect there is provided apparatus comprising: means for determining a first time period after a write enable signal, wherein after the determined first time period a supply of boost charge is disabled to at least one of a pair of bit lines coupled to a memory cell and the at least one of the pair of bit lines are coupled to a write driver.

The apparatus may further comprise means for determining a third time period, the third time period being a difference between the first and a second determined time period, wherein means for determining the third time period comprises means for monitoring a dummy bit line coupled to a second dummy bit line.

The means for monitoring the dummy bit line may comprise: means for discharging the dummy bit line configured to simulate a multiport memory cell short circuit during the third time period following the second determined period; and means for applying a charge source configured to simulate the charge supply circuit applied to at least one of the bit lines.

Means for coupling the dummy bit line to the second dummy bit line may comprise: means for controlling the charging and discharging of the dummy bit line dependent on the potential of the second dummy bit line.

The apparatus may comprise means for determining the second time period comprising means for monitoring the second dummy bit line.

Means for monitoring the second dummy bit line may comprise means for operating a current drain configured to simulate a write enable circuit current drain in at least one of the pair of bit lines following the reception of the write signal.

The means for charging of the dummy bit line may be enabled when the second dummy bit line potential is greater than a determined potential, and discharging may be enabled when the second dummy bit line potential is less than a second determined potential.

The means for monitoring the dummy bit line may comprise means for determining the dummy bit line potential is less than a determined value, wherein determining the first period comprises determining the dummy bit line potential is greater than the predetermined value.

The means for monitoring the dummy bit line may comprise means for determining the dummy bit line potential is greater than a second determined value, wherein the means for determining the second period may comprise means for determining the second dummy bit line potential is greater than the predetermined value.

The apparatus may further comprise: means for enabling, after the second determined time period, a supply of boost charge to at least one of the pair of bit lines coupled to the memory cell; and means for decoupling the at least one of the pair of bit lines from the write driver.

BRIEF DESCRIPTION OF THE DRAWINGS

Reference will be made by way of example only to the accompanying drawings in which.

DETAILED DESCRIPTION OF THE DRAWINGS

This document describes apparatus and methods for operating a dual port or multi-port memory cell write using boost assist or 'negative boost'. The embodiments of the application aim to produce an improvement over the present approaches by applying charge leakage compensation.

Figure 1:
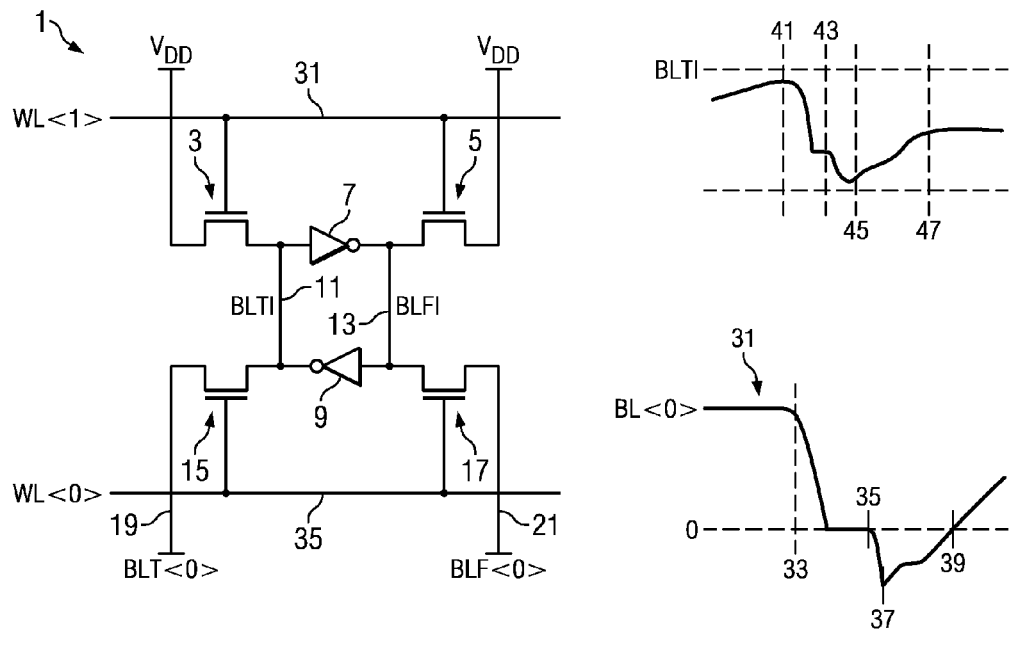
FIG. 1 shows schematically a dual port memory cell suitable for implementing in embodiments of the application.

With respect to FIG. 1, an example dual port memory cell 1 is shown suitable for implementation in some embodiments of the application. With respect to the following examples memory cells operating in memory devices are dual port memory cells, however it would be understood that similar memory devices and operations using the memory devices can implement multi-port memory cells with any suitable number of ports per memory cell.

The memory cell 1 is configured to store a logical bit value. Furthermore in such embodiments couple to a first word line WL<0> 35 and a second word line WL<1> 31 which when enabled connects or couples the memory cell to an associated pair of bit lines (such as BLT<0>, BLF<0> associated with the WL<0>). The memory cell 1 as shown in FIG. 1 is shown as a conventional cross coupled inverter pair configuration such that the output of a first inverter 7 is coupled to the input of a second inverter 9 and the output of the second inverter 9 is coupled to the input of the first inverter 7.

The output of the second inverter 9 (BLTI 11) and the output of the first inverter 7 (BLFI 13) can be furthermore coupled to the associated port bit line pair (for example a first bit line BLT<0> 19, and a second bit line BLF<0> which is the complement of the first bit line) via a first switch transistor 15 and second switch transistor 17 respectively which are configured in a pass transistor arrangement and both of which are as described herein controlled by the first word line WL<0> 35 signal.

The memory cell 1 furthermore can output the second inverter 9 (BLTI 11) and the first inverter 7 (BLFI 13) values to a further associated port bit line pair (which in the example shown in FIG. 1 are coupled to a supply voltage $V_{dd}$) via a third switch transistor 3 and a fourth switch transistor 5 which are configured in a pass transistor arrangement and both of which are as described herein controlled by the second word line WL<1> 31 signal.

In such an arrangement the memory cell shown in FIG. 1 can be used to demonstrate the problem described herein for multiple port memory cells as the output of the first inverter 9 potential is pulled towards zero by the first port as the cell is written to whilst at the same time the second port controlled by the second word line WL<1> is also active and coupling the output of the first inverter 9 to a supply potential and therefore current will pass, or 'leak', through the third switch transistor 3 to the output of the first inverter 9 and the first bit line BLT<0>. Furthermore when the first bit line BLT<0> is floated, or disconnected from the low supply rail such as when injecting a negative boost to the memory cell then the potential input to the second inverter 7 can be insufficient to output or write the value 1.

This is shown in FIG. 1 by the simulated example potential of the bit line BL<0> which shows an initial high level 31 (for example $V_{dd}$), then following the coupling of the bit line BL<0> to the low supply rail (for example ground) shown at time instant 33, the fall of potential to 0 v as charge is drained until the BL<0> reaches close to 0 v as shown at time instant 35, the injection or coupling of a negative bump or boost which by time instant 37 reduces the potential to below the low supply rail, and then as the floating bit line receives charge via the second port the potential starts to rise higher than 0 v at time instant 39.

Furthermore as also shown in FIG. 1 by the graphical representation of potential of BLTI in the same simulation can start at a high level (as shown at time 41), be pulled low following the coupling of the BLTI node to the low supply (as shown as time 43), pulled lower following the negative boost (shown at time 45), but then rise due to charge injection or leakage from a further active port to such a level that it is not able to drive the inverter to output a '1' value (shown at time 47).

Figure 2:
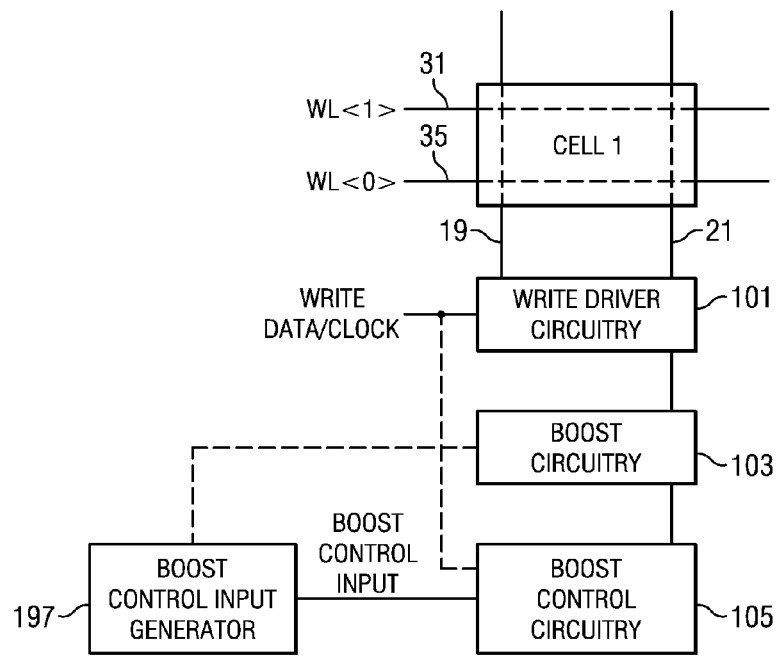
FIG. 2 shows schematically a memory device according to some embodiments of the application.

With respect to FIG. 2 a schematic view of an element of a memory device according to some embodiments is shown. Furthermore with respect to FIGS. 3A and 3B, a further detailed circuit schematic configuration of the memory device shown in FIG. 2 is shown.

With respect to the following examples shown the memory device is shown with a single memory cell, however it would be understood that the memory device can comprise many memory cells arranged in any suitable memory cell configuration and the example shown is for simplifying the explanation of the application. Furthermore the typical operations of memory devices are not described in detail excepting where embodiments of the application relate to them. Thus for example the operation of reading from the memory cell, addressing the memory cell, and writing to the memory other then in embodiments of the application are not described in further detail and can be implemented in any suitable manner.

The memory device, as shown in FIG. 2, comprises a memory cell 1. The memory cell 1 is configured to store a logical bit value and has been described in detail with respect to FIG. 1. The memory cell 1 shown in FIG. 3A has a structure similar to that shown and described with respect to FIG. 1. It would be understood that the memory cell can be any suitable memory cell configuration.

The memory device furthermore comprises write driver circuitry 101 configured to be coupled to the memory cell 1 via the bit lines BLT<0> and BLF<0> and further couple one or other of the bit lines BLT<0> and BLF<0> to further circuitry and/or a low voltage supply rail. In some embodiments such as shown in FIG. 2 the write driver circuitry 101 is configured to couple one or other of the bit-lines to boost circuitry 103.

Furthermore as shown in FIG. 3 the write driver circuitry 101 can comprise a pair of NOR gates receiving a data or complimentary data input (write signal) and a write clock signal, the output of each NOR gate being coupled to a gate terminal of a pass transistor coupling the true (BLT) or complimentary (BLF) bit-line to the further circuitry and/or a low voltage supply rail. However the implementation of the write driver circuitry 101 can be implemented by any suitable means.

Figure 3A:
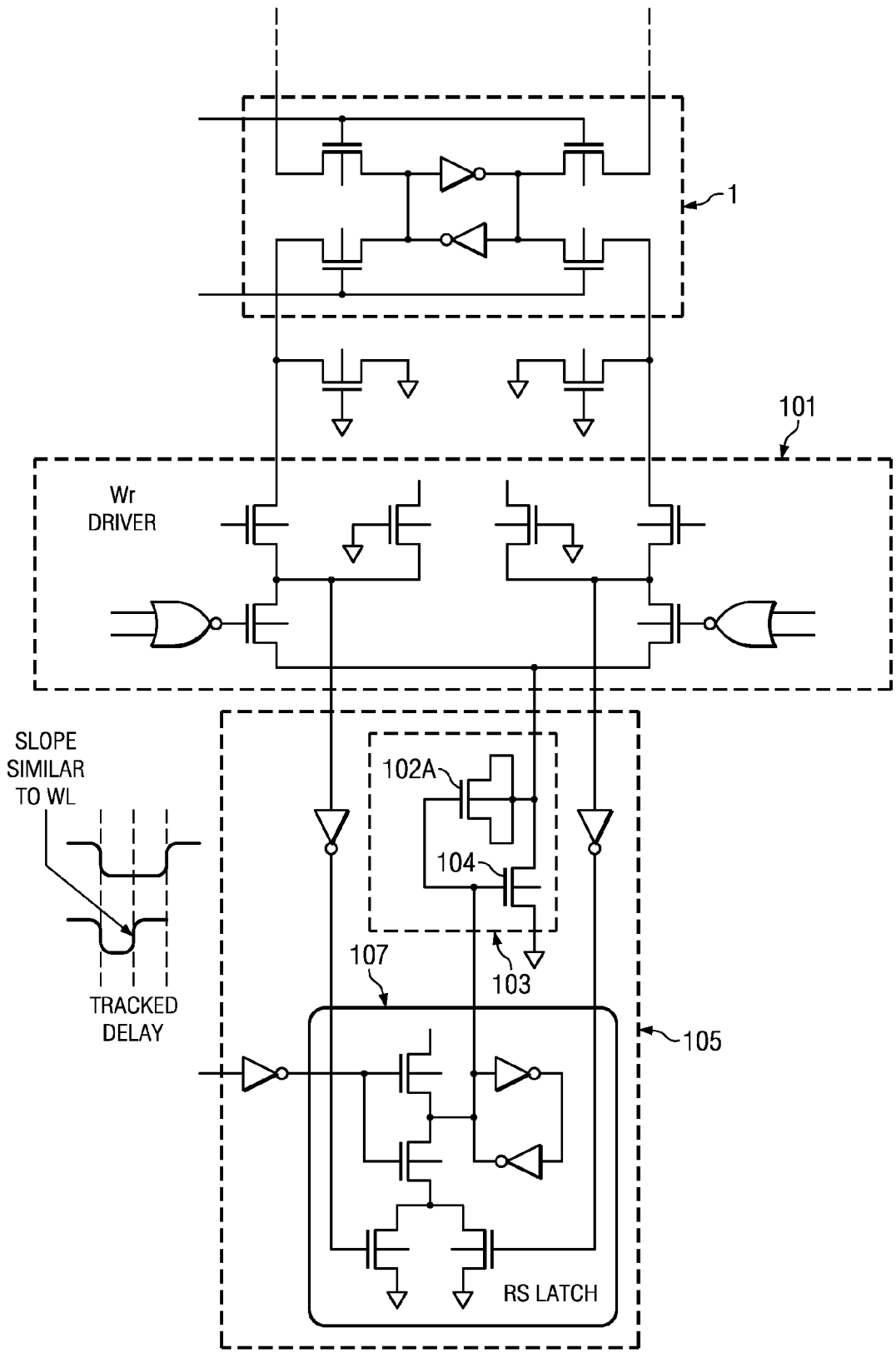
FIGS. 3A and 3B show schematically the memory device shown in FIG. 2 in further detail.
Figure 3B:
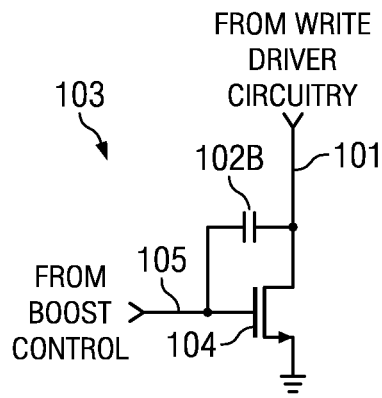

The memory device furthermore in some embodiments comprises boost circuitry 103 configured to in a first mode of operation (a boost disabled mode) to couple the selected bit line to a low voltage supply and in a second mode of operation (a boost enabled mode) to supply a 'negative boost' or negative potential bump to the coupled bit line. In some embodiments, such as shown in FIG. 3A, the boost circuitry can comprise a CMOS transistor 102A configured in a capacitor arrangement, and a pass transistor 104 (which in some embodiments is a nmos transistor) for selectively coupling the selected bit line to a low voltage supply. In other embodiments, such as shown in FIG. 3B, the boost circuitry 103 may comprise other capacitor structures 102B in place of the transistor 102A. Both the transistor 102A and the capacitor structures 102B may be referred to herein as capacitor 102.

The capacitor 102 and pass transistor 104 are configured to operate such that when the boost circuitry 103 is disabled the capacitor has a first terminal coupled to a positive voltage and the other terminal coupled to the bit line and the pass transistor gate which also receives the positive voltage is configured to couple the selected bit line to a low supply voltage rail. In other words the pass transistor 104 operates as a current drain for the selected bit line.

The capacitor 102 and pass transistor 104 are configured to operate such that when the boost circuitry 103 is enabled the capacitor 102 has a first terminal coupled to a low voltage and the other terminal coupled to the bit line instantaneously drops to instantaneously maintain the same potential across the terminals as just before the boost enable operation and the pass transistor gate which also receives the low voltage is configured to decouple the selected bit line from a low supply voltage rail. In other words the pass transistor 104 causes the selected bit line to 'float'.

However in other embodiments any suitable negative boost circuitry configuration can be implemented using any suitable capacitor or charge generator.

The memory device furthermore comprises boost control circuitry 105 which in some embodiments is configured to operate the boost circuitry 103, in other words to trigger the enablement or disablement of the boost circuitry 103. The boost control circuitry 105 can generate the control signal for the boost circuitry 103 dependent on inputs received from the write driver circuitry 101 and from a boost control input generator 197.

The boost control circuitry 105 in some embodiments, as shown in FIG. 3A, comprises a reset set latch (RS Latch) 107. The latch 107 can comprise a pair of cross coupled inverters of which the state of which can be defined as the boost control input generator 197 signal passed through a pair of serial invertors when the latch detects that at least one of the bit lines is at low state and is defined as the current state of the cross coupled inverters otherwise.

Figure 5:
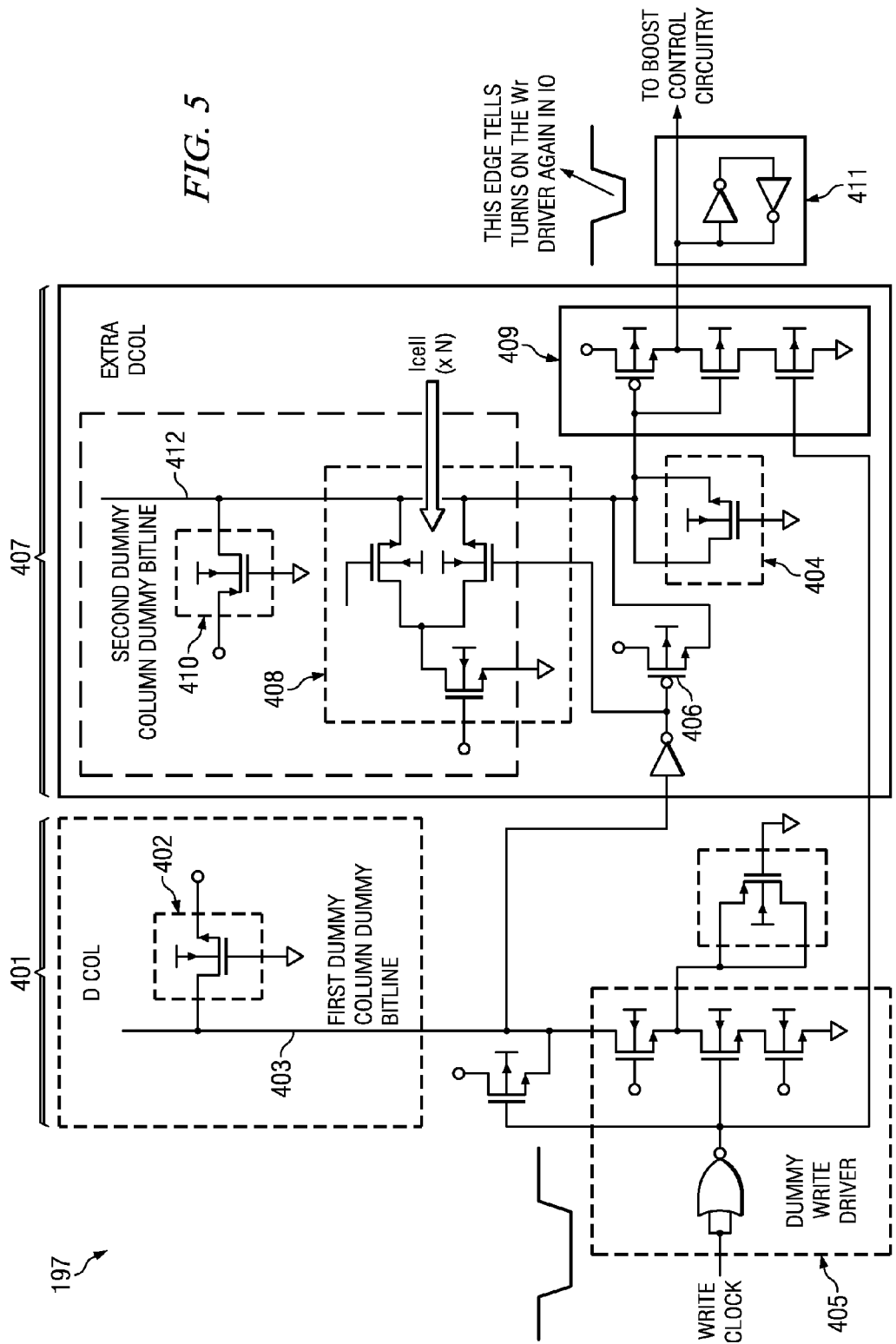
FIG. 5 shows schematically the memory device control input generator shown in FIG. 2 in further detail.

With respect to FIG. 5 the boost control input generator 197 is shown according to some embodiments. The boost control input generator 197 is configured to generate a control signal enabling the boost control circuitry 105 to activate the boost at a defined time period but also deactivate the boost at a second time period to compensate for current injection or leaks into the bit line by enabling a current drain to occur.

In such embodiments the boost control input generator 197 can comprise a pair of dummy columns or bit lines with dummy components or loads configured to determine both the first boost activation period and the second boost deactivation signals. In other words as described herein the first dummy bit line 403 can be used to track time between the switching on the write driver and the provision of the boost, and the second dummy bit line 412 can be used to track the zero cross-over time as the cell 408 emulates the short-circuit current shown by the transistor 3 in FIG. 1. This can be summarised as the sequence as: the write clock turns on the dummy write driver 405 which causes the bit line 403 potential to fall and turn on the cell 408 and turning off transistor 406 which discharges the second dummy column bit line 412 and therefore simulating the time equivalent to the zero cross-over time in the actual memory cell and produce the deactivating signal.

The boost control input generator 197 first dummy column 401 can comprise in some embodiments a dummy bit line 403 coupled to a dummy write driver 405. The dummy bit line 403 can in some embodiments as shown in FIG. 5 be coupled to a dummy load 402. The dummy bit line 403 and load 402 are configured to simulate the performance of the actual bit line BLT<0>/BLF<0> as it discharges and therefore to monitor the fall time. The fall time of the actual bit line can then be emulated by dummy bit line 403 in which load 402 provide the drain load compared to BLT<0> line. The zero crossing time estimation (by which the actual bit line BLT<0> crosses a zero voltage due to short-circuit current (Icurrent)) is done through the second dummy column bit line 412 in which the cell 408 provides the current equivalent to Icurrent and load element 410 is configured to provide the simulation of the bit line load.

The dummy write driver 405 can comprise in some embodiments a NOR gate with both inputs being coupled to the write clock signal and having an output driving a transistor switch coupling the dummy bit line 403 to a low supply voltage, in other words activating a current drain to the dummy bit line 403. In some embodiments the dummy write driver can further comprise a capacitor arranged transistor coupled to the bit line and low supply voltage to provide further loading effects. The dummy bit line 403 is furthermore in some embodiments configured to be coupled to the second dummy column 407 in such a way that when the first dummy bit line 403 voltage approaches a low state a second dummy column bit line is coupled to a high or positive supply voltage, by for example passing an inverted dummy bit line 403 voltage to a pmos transistor gate 406, where the pmos transistor source is coupled to the positive supply voltage and the pmos transistor drain coupled to the second dummy column 407 bit line 412. In some embodiments the a second dummy column bit line is further configured to be selectively coupled to a current drain (a nmos transistor) via at least one pass transistor which are nmos transistors with the gate coupled to the inverted first dummy column bit line. In other words the second dummy column bit line is configured to be coupled to a current source 406 where the second dummy column bit line is initially charged as the first dummy column bit line is discharging and when the first dummy column bit line is discharged the second dummy column bit line is decoupled from the current source 406 and coupled to a current drain (Dummy Cell 408). The second dummy column 407 furthermore comprises a capacitor (dummy boost circuitry 404) to simulate the effect of the boost circuitry. In some embodiments the capacitor/dummy boost circuitry can be implemented by a capacitor configured transistor with one terminal coupled to the low supply voltage and the other to the second dummy column bit line.

In some embodiments second dummy column bit line 412 can be further coupled to an output activator 409. The output activator 409 can comprise a selective inverter which in some embodiments receives the second dummy column bit line input into a pair of transistors in a inverter arrangement the drain of the second of the transistors being further coupled to further nmos transistor source which is selectively coupled to a low supply dependent on the output of the dummy write driver NOR gate output. In other words the operation only enables an inverted signal from the second dummy column bit line while a write cycle is active. Furthermore in some embodiments the boost control input generator comprises an output latch 411 comprising a pair of cross coupled inverters with one of the coupled nodes coupled to the output of the output activator 409 and configured to maintain a well defined output signal. The output of the output latch 411/output activator 409 can then be coupled to the boost control circuitry 105 providing suitable timing periods for enabling and disabling the boost according to embodiments of the application.

In other words the default state of dummy bit line 403 and 412 is high as can be seen in FIG. 5. During the write cycle, the write signal triggers discharging of the second dummy bit line which in turn triggers a discharge of the dummy bit line which subsequently disables the boost circuit and re-connects the write driver.

Figure 4:
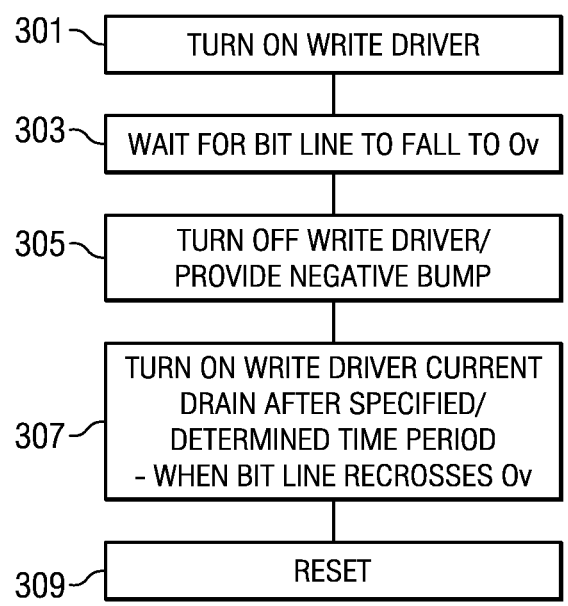
FIG. 4 shows a flow diagram of the operations performed by the memory device according to some embodiments of the application.

With respect to FIG. 4 the operation of memory device according to embodiments of the application is described in further detail.

The write enable circuitry 101 is initially switched on in other words a write signal/write clock signal is applied to the memory cell on the bit lines 19, 21. The write signal is also applied to the boost control input circuitry enabling the activation of the first dummy column bit line discharge and also the second dummy column bit line charge.

The operation of switching on or turning on the write driver is shown in FIG. 4 by step 301.

Furthermore the boost control circuitry 105 is configured to wait for the bit line voltage to fall to 0 volts. The operation of waiting for the bit line to fall to 0 V is shown in FIG. 4 by step 303. Furthermore the first dummy column bit line has also fallen to the low supply voltage (0 v) and has activated the second dummy column bit line discharge cycle by coupling the current drain (Icell 408) and decoupling the current source 406.

The bit line voltage falling to 0 v is further caused to activate the boost control circuitry 105 to activate the boost. In other words the current drain associated with the selected bit line is switched off and the boost control circuitry is enabled or activated and a negative bump or boost is applied to the selected bit line.

The activation of the negative bump is shown in FIG. 4 by step 305.

Then after a specified or determined time period defined by the discharging rate of the second dummy column bit line by the current drain and the capacitor to simulate the point when the bit line recrosses the zero volt line the boost control input generator 197 is configured to output a signal to the boost control circuitry 105 to deactivate the boost circuitry, in other words to couple the current drain back to the bit line.

The turning on of the write driver current drain after the determined time period is shown in FIG. 4 by step 307.

Furthermore there after the write operation has been completed the process is reset.

The operation of the resetting the operation is shown in FIG. 4 by step 309.

Figure 6A:
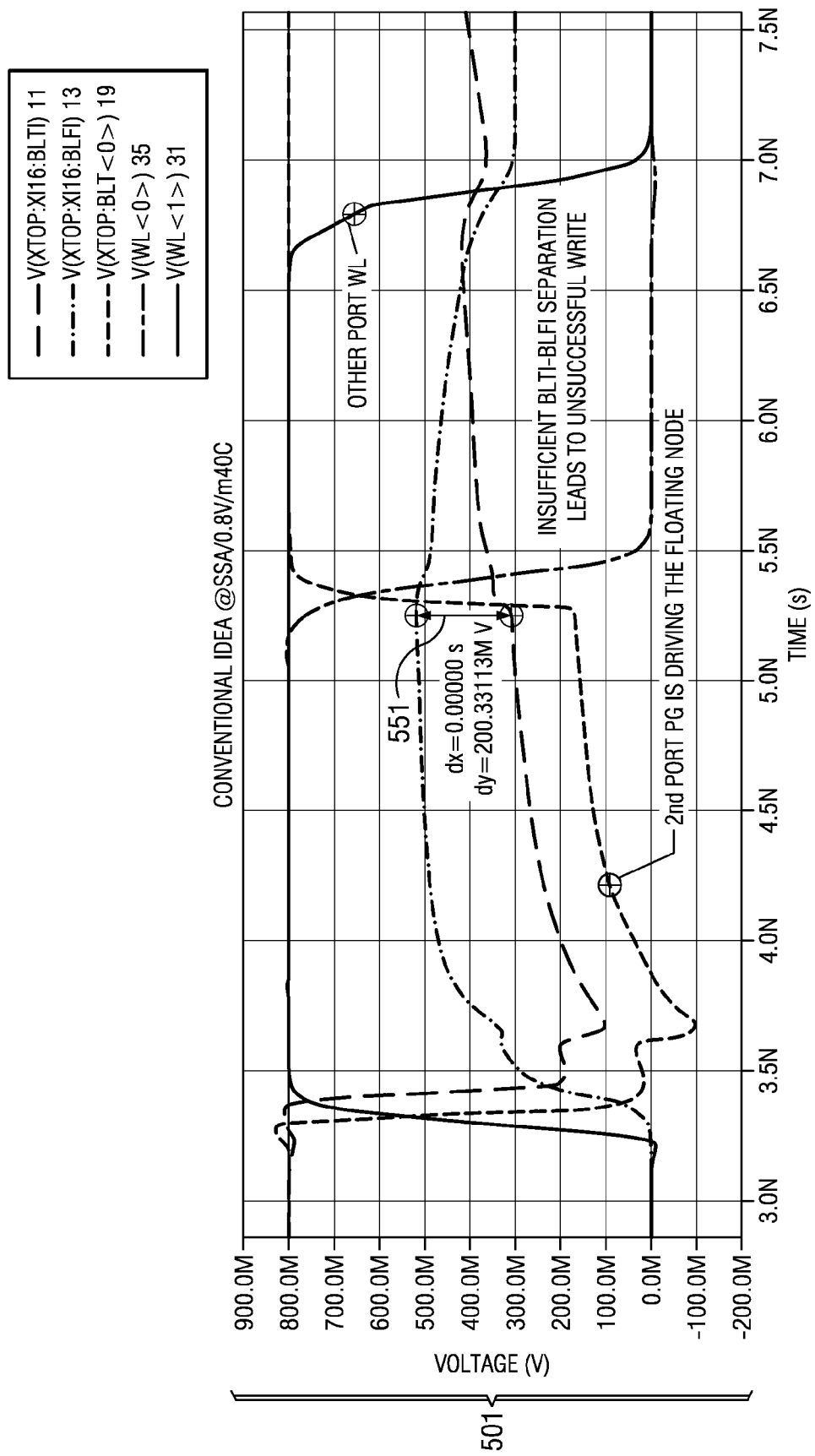
FIGS. 6A and 6B show a graphical representation of simulated operations performed by some embodiments of the application against simulated operations performed by conventional memory write operations.
Figure 6B:
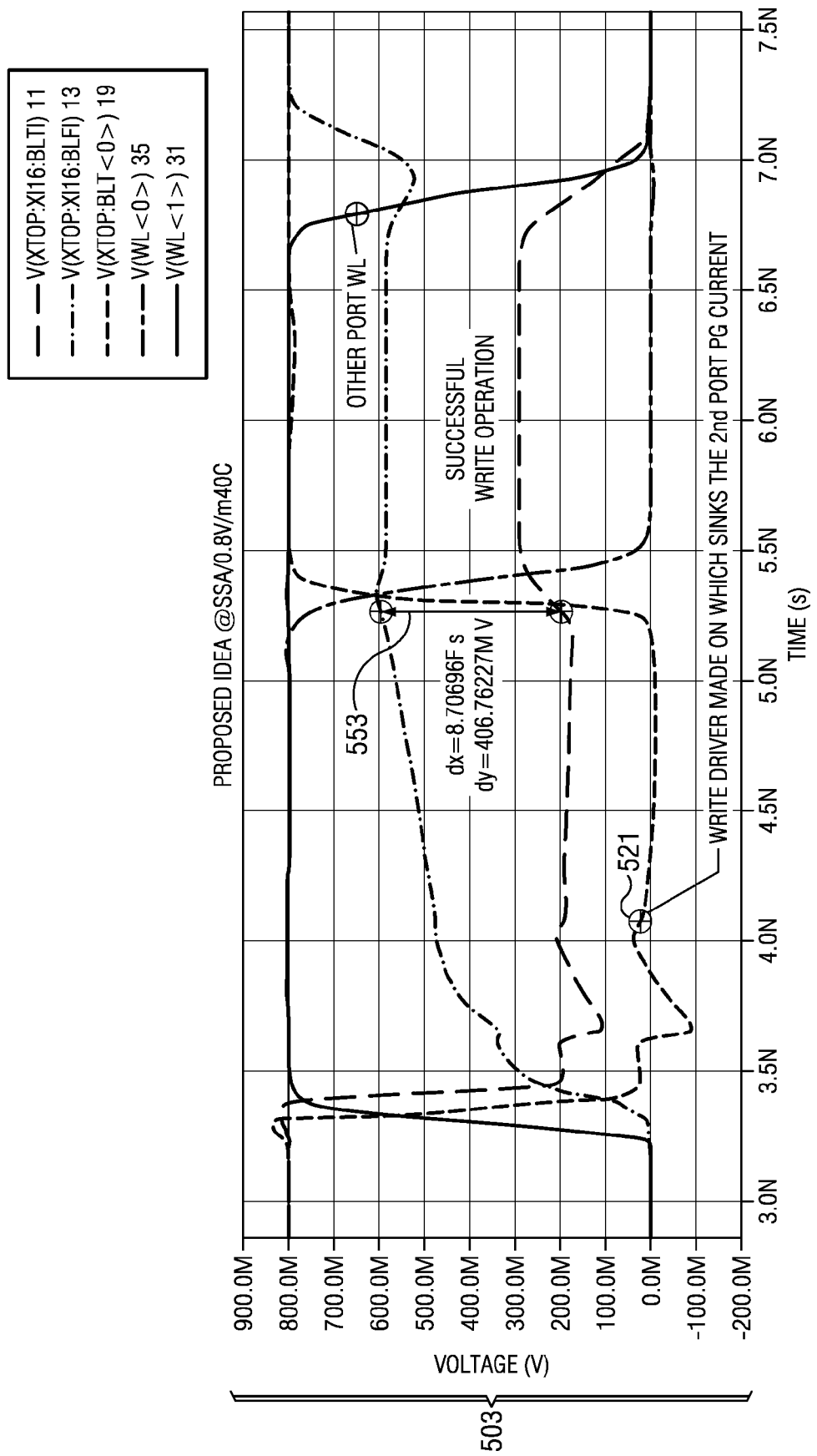

With respect to FIGS. 6A and 6B, timing diagrams are shown of an example of an embodiment of the application write cycle 503 (FIG. 6B) against a conventional memory device write cycle 501 system (FIG. 6A).

As can be seen in the conventional memory device the bit line true BLT voltage rises as the second port drives the floating node such that at the region of determination 551 there is a voltage difference of only 200 mV between the nodes BLTI 11 and BLFI 13 of the memory cell 1. This small difference can lead to write failures as discussed.

This can be compared against the simulation of embodiments of the application where at the 'zero crossing' 521 defined by the boost control input generator time instant the write driver/boost circuit drain is switched on which sinks the second port potential driving current. This compensation effect causes the potential not to rise such that at the region of determination 553 the bit line internal voltage difference of 406 mV enables a successful write operation.

Although embodiments have been described wherein timing signals are determined or dependent on dummy bit line or bit lines and used to activate the negative boost/deactivate the negative boost circuitry it would be understood that in other embodiments other means and methods for generating the timing signals could be implemented in some other embodiments of the application. For example the control signals can be generated in some embodiments by monitoring the bit lines directly rather than by monitoring dummy bit lines to determine the modes of operating the boost circuitry.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this application can be implemented by computer software executable by a data processor, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

As used in this application, the term 'circuitry' can refer to hardware-only circuit implementations (such as implementations in only analog and/or digital circuitry) and to combinations of circuits and software (and/or firmware), such as: to a combination of processor(s) or (ii) to portions of processor(s)/software (including digital signal processor(s)), software, and memory(ies) that work together to cause an apparatus, such as a mobile phone or server, to perform various functions and to circuits, such as a microprocessor(s) or a portion of a microprocessor(s), that require software or firmware for operation, even if the software or firmware is not physically present.

This definition of 'circuitry' applies to all uses of this term in this application, including any claims. As a further example, as used in this application, the term 'circuitry' would also cover an implementation of merely a processor (or multiple processors) or portion of a processor and its (or their) accompanying software and/or firmware.

While this detailed description has set forth some embodiments of the present invention, the appended claims cover other embodiments of the present application which differ from the described embodiments according to various modifications and improvements. Other applications and configurations may be apparent to the person skilled in the art.

What is claimed is:

1. A circuit, comprising:
a memory cell including at least one bit line;
a write driver circuit coupled to the at least one bit line;
a boost circuit coupled to the write driver circuit and configured to apply a boost voltage to the at least one bit line through the write driver circuit; and
a boost control circuit configured to detect a falling of the at least one bit line to a low supply voltage in preparation for a write operation on the memory cell, activate the boost circuit to apply the boost voltage below the low supply voltage in response to said detection and deactivate the boost circuit in response to expiration of a delay period representing a rise of the at least one bit line above said low supply voltage.

2. The circuit of claim 1, wherein the boost control circuit comprises a first dummy bit line and a first sense circuit configured to sense a discharge of the first dummy bit line to a first threshold value as a trigger for activating the boost circuit.

3. The circuit of claim 2, wherein the boost control circuit further comprises a second dummy bit line and a second sense circuit configured to sense a discharge of the second dummy bit line to a second threshold value as a trigger for deactivating the boost circuit.

4. The circuit of claim 3, wherein the boost control circuit is further configured to discharge the second dummy bit line in response to said first sense circuit sensing the discharge of the first dummy bit line.

5. The circuit of claim 3, wherein a time of discharge of the second dummy bit line is representative of a time for the rise of the at least one bit line above said low supply voltage.

6. The circuit of claim 5, wherein a time of discharge of the first dummy bit line is representative of a time for discharge of the at least one bit line to said low supply voltage.

7. A circuit, comprising:
a memory cell including at least one bit line;
a write circuit configured to discharge said at least one bit line in preparation for a write operation to said memory cell;
a negative boost circuit configured to supply a negative boost voltage; and
a control circuit configured to activate the write circuit to discharge said at least one bit line to a low supply voltage; apply the negative boost voltage to said at least one bit line following discharge of said at least one bit line to said low supply voltage to drive voltage on said at least one bit line below the low supply voltage; and disconnect the negative boost voltage from said at least one bit line in response to a subsequent rise in voltage on said at least one bit line above the low supply voltage.

8. The circuit of claim 7, wherein the control circuit comprises a first dummy bit line and a first sense circuit configured to sense a discharge of the first dummy bit line to a first threshold value and in response thereto apply the negative boost voltage to said at least one bit line.

9. The circuit of claim 8, wherein the control circuit further comprises a second dummy bit line and a second sense circuit configured to sense a discharge of the second dummy bit line to a second threshold value and in response thereto disconnect the negative boost voltage from said at least one bit line.

10. The circuit of claim 9, wherein the second dummy bit line is discharged in response to the sensed discharge of the first dummy bit line.

11. The circuit of claim 9, wherein a time of discharge of the second dummy bit line is representative of a time for the subsequent rise in voltage on said at least one bit line above the low supply voltage.

12. The circuit of claim 11, wherein a time of discharge of the first dummy bit line is representative of a time for discharge said at least one bit line to the low supply voltage.

13. A method, comprising:
discharging at least one bit line of a memory cell to a low supply voltage in preparation for a write operation to said memory cell;
connecting a negative boost voltage to said at least one bit line following discharge of said at least one bit line to said low supply voltage to drive voltage on said at least one bit line below the low supply voltage; and
disconnecting the negative boost voltage from said at least one bit line in response to a subsequent rise in voltage on said at least one bit line above the low supply voltage.

14. The method of claim 13, further comprising sensing discharge of said at least one bit line to said low supply voltage.

15. The method of claim 14, wherein sensing comprises sensing discharge of a first dummy bit line as indicative of the discharge of said at least one bit line to said low supply voltage.

16. The method of claim 13, further comprising sensing the subsequent rise in voltage on said at least one bit line above the low supply voltage.

17. The method of claim 16, wherein sensing comprises sensing discharge of a second dummy bit line as indicative of the subsequent rise in voltage on said at least one bit line above the low supply voltage.

18. The method of claim 13, further comprising sensing a discharge of a first dummy bit line to a first threshold value and in response thereto connecting the negative boost voltage.

19. The method of claim 18, further comprising sensing a discharge of a second dummy bit line to a second threshold value and in response thereto disconnecting the negative boost voltage.

20. The method of claim 19, further comprising discharging the second dummy bit line in response to sensed discharge of the first dummy bit line.

21. The method of claim 19, wherein a time of discharge of the second dummy bit line is representative of a time for the subsequent rise in voltage on said at least one bit line above the low supply voltage.

22. The method of claim 21, wherein a time of discharge of the first dummy bit line is representative of a time for discharge said at least one bit line to the low supply voltage.

* * * * *